Aug. 27, 1968 C. F. AULT 3,399,355
TRANSISTOR AMPLIFIER WITH CLASS AB BIASING CIRCUIT
Filed Dec. 2, 1965
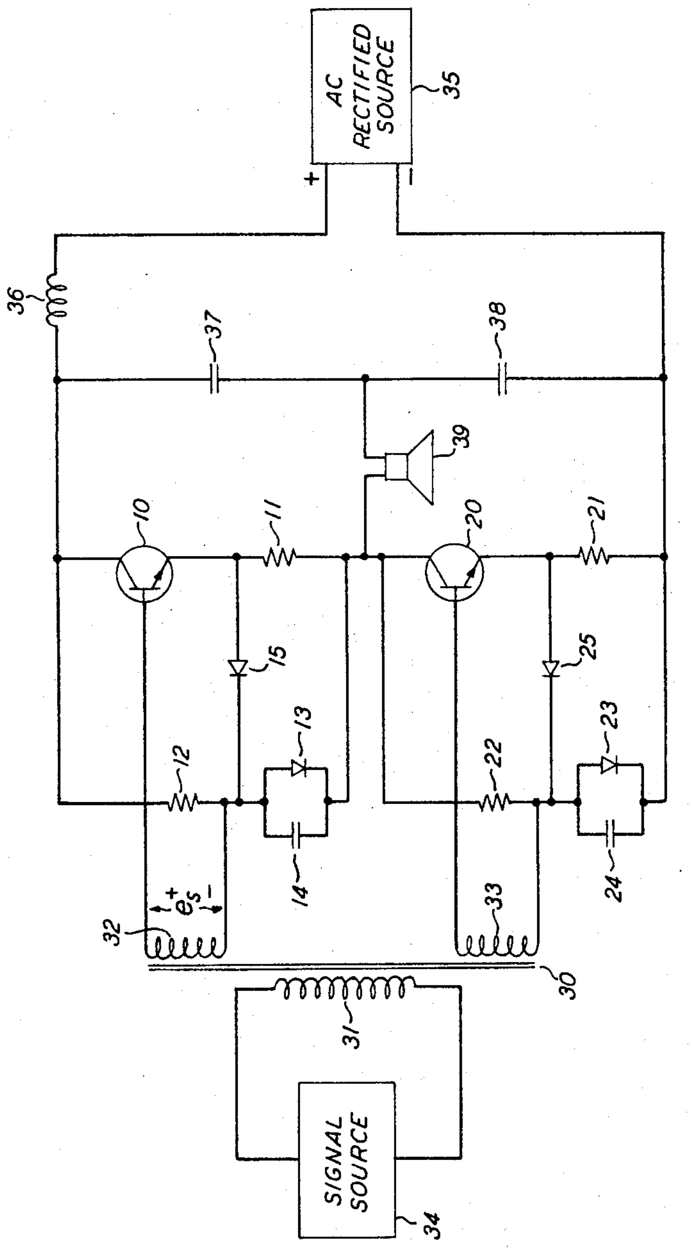
INVENTOR
C. F. AULT
BY John P. McDonnell
ATTORNEY 3,399,355
Patented Aug. 27, 1968

3,399,355

TRANSISTOR AMPLIFIER WITH CLASS AB BIASING CIRCUIT

Cyrus F. Ault, Lincroft, N.J., assignor to Bell Telephone Laboratories, Incorporated, New York, N.Y., a corporation of New York Filed Dec. 2, 1965, Ser. No. 511,183
4 Claims. (Cl. 330—15)

ABSTRACT OF THE DISCLOSURE

A separate biasing circuit for each transistor of a push-pull amplifier includes an emitter-degenerative feedback resistor. A voltage divider comprising a resistor in series with the parallel combination of a normally forward biased diode and a capacitor is supplied from the DC source. The input signal is inserted between the voltage divider junction and the transistor base to provide positive bias at zero signal for linear class AB operation. A second diode connected between the emitter and the voltage divider junction provides, together with the first diode, a high signal bypass of the emitter resistor for improved efficiency.

This invention relates to amplifiers generally and more particularly to high power lightweight and compact semiconductor amplifiers having good fidelity.

Power amplifiers are used in a host of applications to convert a low power signal derived from a source to one of suitable magnitude for a utilization device, be it a loudspeaker or a servo-mechanism linkage. Characteristically, push-pull amplifier stages are used at the power stage of such amplifiers to obtain the high power handling capacity with low distortion that is inherent in such a configuration. Since many applications call for power amplifiers which are lightweight, compact and cool running, recourse has been had to semiconductor amplifier devices such as transistors. Additionally, push-pull output stages of transformerless design have been used by inserting, where necessary, blocking capacitors in series with the load to further decrease the amplifier bulk and weight.

A problem relating to the use of transistors in push-pull power stages arises in the attempt to obtain good fidelity of signal reproduction without a sacrifice of power drain from the DC source. Since operation of transistor push-pull stages in class B results in harmonic distortion by virtue of the nonlinearity of the transistor characteristics near cutoff (producing zero axis crossover notches in the output signal waveform), resort has been had to class AB operation. By operating in this fashion, zero axis crossover distortion is eliminated since some idling current flows through the output of each transistor prior to the time that an input signal appears for amplification. However, with this type of operation existing biasing circuits providing sufficient stability require an inordinately large proportion of total power from the DC supply. The large power consumption results from the need to provide a small forward bias with a network having sufficiently small base circuit impedance to accommodate the large drive current. The large power drain suffered, if tolerated, decreases the portability of such amplifiers by increasing the size and weight of the power supply required whether it is derived from battery packs or rectified and filtered AC. Furthermore, the physical size of biasing circuit elements in the overall amplifier package needs to be increased in order to accommodate the large power dissipated.

Accordingly, it is a principal object of this invention to provide an improved power amplifier design of decreased size and weight.

Another object of the invention is to provide a cool running power amplifier with reduced average power drain.

Still another object of the invention is to provide an improved biasing circuit for a push-pull transistor power amplifier.

Yet another object of the invention is to provide in a class AB amplifier a stable biasing circuit which has a greatly reduced power dissipation.

In a principal embodiment of the invention an amplifier power stage consisting of a pair of transistors is arranged in a push-pull configuration. A separate emitter degenerative feedback biasing circuit individual to each transistor is employed to provide stabilized class AB operation with a greatly reduced power consumption and power drain. In each biasing circuit, a first diode connected as an element in a voltage divider circuit, provides, by means of its forward-biased voltage drop, the voltage needed to slightly forward bias the base of the transistor. A capacitor in parallel with this diode provides a needed AC bypass for the signal. A second diode is connected between the emitter and the first diode and together the two act to provide both a low impedance discharge path for the capacitor and a shorting path to eliminate the degenerative feedback to decrease the base circuit impedance drive power required once the signal exceeds a threshold value. With this design the power otherwise wasted in the bias circuit is greatly reduced and the need for a large emitter resistor bias capacitor is eliminated. A further reduction of the size and weight occurs by virtue of the transformerless output design which utilizes a pair of capacitors both as blocking capacitors in series with the load and as filter elements for the power supply.

Other objects and features of the invention will become evident and more fully understood from consideration of the following description when read in connection with the accompanying drawing in which a schematic circuit diagram of a transistor amplifier embodying the invention is shown.

As shown in the drawing, a pair of transistors 10 and 20 of similar conductivity are connected in a push-pull configuration to provide the power amplification generally required in the last stage of a power amplifier. A transformer 30 having primary winding 31 and a pair of secondary windings 32 and 33, respectively, is shown as the coupling means between a signal source 34 and the input to each transistor in the push-pull amplifier stage. The signal source 34 shown here is symbolically used to represent the output from any preceding preamplifier and amplifier stages. DC power to bias the transistors is shown as being obtained from an accompanying AC rectified source 35 which is shown to be filtered by the choke input L-filter consisting of inductor 36 and capacitors 37 and 38. The power amplifier push-pull stage output is illustratively shown driving a loudspeaker 39 as a load. While not shown in the drawing, it is permissible to put a ground at the junction of capacitors 37 and 38.

Transistors 10 and 20 are of the NPN type and are arranged in cascade so that the same average current flows through each. An output terminal of transistor 10 is its collector which is connected to the positive side of the DC source. The emitter of transistor 10 is connected to the collector of transistor 20 through resistor 11 and the emitter of transistor 20 is connected through resistor 21 to the negative side of the DC source. The output terminal from transistor 20 is at the junction of resistor 21 with the negative side of the source, and the junction of resistor 11 with the collector of transistor 20 is the common terminal.

The biasing circuits for each of the transistors include identical networks serially connected between the positive and negative sides of the DC source with their junction connected to the common terminal. The biasing circuit for transistor 10 consists of emitter resistor 11 providing degenerative feedback, the voltage divider circuit between collector and the common terminal consisting of resistor 12 connected in series with the parallel combination of diode 13 and capacitor 14, and diode 15 connected between the emitter and the junction of the two arms in the voltage divider circuit. In a similar fashion, resistors 21 and 22, diodes 23 and 25 and capacitor 24 are connected to bias transistor 20.

In the quiescent state with no signal input each transistor is biased for class AB operation by providing a small forward bias for the base-emitter junction. Illustratively, in connection with transistor 10, this small forward bias is obtained by virtue of the difference in voltages appearing across forward-biased diodes 13 and the drop in resistor 11. The differences in voltages across diode 23 and resistor 21 provide the corresponding forward bias for transistor 20.

The desirability of class AB operation arises out of the fact that a small amount of current is flowing through the transistor prior to the appearance of the signal. This small current flow eliminates the class B zero axis crossover notch that would otherwise appear in the output signal waveform due to the nonlinearity in transistor characteristics near cutoff. By eliminating this significant source of distortion, the amplifier is rendered capable of reproducing the signal with a high degree of fidelity.

Implementation of the desirable class AB operation without the concomitant large power drain and dissipation is possible through the bias circuit provided. For example, in connection with transistor 10, current from the DC source flowing through resistor 12 and diode 13 produces a low resistance voltage across diode 13 to forward bias the base-emitter junction of transistor 10. The use of diode 13 in place of a resistor has numerous advantages. Since it does not increase the base circuit impedance by any significant amount, a smaller quantity of signal source power is required than if a resistor dropping the same voltage was used in its place. Furthermore, the use of a diode permits resistor 12 to be larger than otherwise permissible in obtaining the bias voltage required. Since the bias circuit drops approximately one-half the DC supply voltage, which voltage must be sufficiently large to provide the output power required, the use of the diode obviously results in a considerable savings in otherwise wasted power.

Capacitor 14, connected in parallel with diode 13, provides the diode with an AC bypass which is needed when the transistor input signal $e_s$, defined in the diagram as the voltage across winding 32 of transformer 30, goes positive. In the absence of this bypass provision, the signal of the polarity shown would back-bias diode 13 and thereby prevent signal amplification by transistor 10. Capacitor 14, functioning in this manner, accumulates a charge by virtue of the base current flowing while diode 13 is back-biased and therefore tends to produce a voltage across itself which is of a polarity to cut off transistor 10. If nothing more were done considerable distortion would be introduced in the output waveform in response to a succeeding signal peak of the same polarity arriving before the capacitor discharged sufficiently. The presence of diode 15 remedies this undesirable situation.

As the signal voltage driving transistor 10 increases, the voltage drop across resistor 11 also increases until it exceeds the threshold value of diodes 15 and 13 connected in series across resistor 11 as shown. When the threshold value is exceeded, the charge on capacitor 14 is rapidly removed through the low resistance discharge path which includes diode 15 and resistor 11. Furthermore, when these diodes are forward-biased they act to short out resistor 11, thereby removing the degenerative feedback. This decrease of base-emitter circuit impedance reduces the base drive power required. The resistance value of resistor 11 must be small enough so that diodes 13 and 15 are not forward-biased in the absence of signal and are yet large enough to forward bias both diodes in response to signal increases of small magnitude.

By virtue of the biasing circuit described, the amplifier is capable of peak powers far in excess of idling power. This is accomplished with good fidelity, no requirement for adjustable elements and with good temperature stability. Because of the decreased dissipation in the bias circuit resistors, the drain on the power supply is reduced, thereby reducing the weight and bulk of power supply elements required. Furthermore, the bias circuit resistors do not need to have as large a physical size as would otherwise be required with larger powers dissipated therein. Finally, the need for an emitter resistor bypass capacitor which would otherwise be of large value and size is eliminated by virtue of the action of diodes 13 and 15 in removing the degenerative feedback at the appropriate time.

To further reduce the bulk and weight of the amplifier stage, a transformerless output circuit is shown wherein capacitors 37 and 38 are connected in series across the DC line after the choke filter 36. These capacitors are bifunctional in that they act as filter elements in a low-pass L-filter which includes choke coil 36 while simultaneously functioning as blocking capacitors to prevent DC from flowing through the loudspeaker 39. Thus, by having the power supply and speaker share the same capacitors, the need for an additional blocking capacitor in series with the speaker is eliminated. Furthermore, this design permits the same average current to flow through both transistors 10 and 20 by providing for an automatic adjustment in collector-emitter bias voltage to compensate for any inherent differences in the transistor characteristics. This is of course necessary if no DC is to be permitted to flow through the load 39.

It is to be understood that the above-described arrangements are illustratvie of the application of the principles of the invention. Numerous other arrangements may be devised by those skilled in the art without departing from the spirit and scope of the invention.

What is claimed is:

1. In a push-pull transistor power amplifier supplied from a DC source and having separate input terminals for each transistor connected to a signal source, a biasing circuit individual to each transistor comprising an emitter degenerative feedback resistor, a voltage divider circuit supplied from said DC source having a resistive arm and a second arm consisting of a first diode element and a bypass capacitor, said second arm being DC coupled through said signal source to said input terminals, and a second diode element connected in series with said first diode across said feedback resistor, said diodes being poled to simultaneously provide class AB bias and a shorting connection across said feedback resistor when said signal exceeds a threshold value.

2. An amplifier in accordance with claim 1 wherein said transistors are of like conductivity and wherein each of said transistor input terminals are connected to said signal source through a transformer.

3. An amplifier in accordance with claim 2 wherein each of said transistors have base, emitter and collector electrodes, said base electrode corresponding to the input terminal for each transistor, said transistors being connected in cascade to conduct the same average current, said transformer having a secondary winding individual to each transistor and wherein each secondary winding is coupled between an input terminal and the junction of the arms of said voltage divider circuit.

4. A power amplifier comprising a pair of transistor amplifiers connected in push-pull configuration with individual output terminals, individual input terminals and a common terminal coupled to a common load, a signal source transformer coupled to each of said input terminals, a DC power supply consisting of an AC voltage rectifier and filter, a pair of bifunctional capacitors series connected across said DC supply with each capacitor further connected at their junction to said load to both filter the DC supply and decouple said load from each of said output terminals and a biasing circuit including an emitter degenerative resistor individual to each transistor and a voltage divider circuit having two component sections series connected to said DC supply and connected at their junction to said common terminal, each of said sections having a resistive arm and a second arm consisting of a first diode element and a bypass capacitor, the junction of said arms being DC coupled through said transformer to said input terminal, and a second diode element connected between the junction of said arms and said feedback resistor, said first and second diodes being poled to simultaneously provide class AB bias and a shorting connection across said feedback resistor when said signal exceeds a threshold value.

References Cited

UNITED STATES PATENTS 2,951,208 8/1960 Barton ------------- 330—24 X

FOREIGN PATENTS 1,155,487 10/1963 Germany.

OTHER REFERENCES

Geisler, "Transistor Power Amplifier Circuit Directory," Radio Electronics, pp. 32, 33, October 1963.

ROY LAKE, *Primary Examiner.*

L. J. DAHL, *Assistant Examiner.*